United States Patent [19]
Tsuchida et al.

[11] Patent Number: 5,933,051
[45] Date of Patent: Aug. 3, 1999

[54] CONSTANT-VOLTAGE GENERATING DEVICE

[75] Inventors: Kenji Tsuchida, Kawasaki; Yoshio Okada, Tokyo, both of Japan

[73] Assignee: Kabushiki Kaisha Toshiba, Kawasaki, Japan

[21] Appl. No.: 08/714,291

[22] Filed: Sep. 18, 1996

Related U.S. Application Data

[63] Continuation of application No. 08/591,942, Jan. 23, 1996, abandoned, which is a continuation of application No. 08/257,183, Jun. 8, 1994, abandoned.

[30] Foreign Application Priority Data

Jun. 8, 1993 [JP] Japan .................................... 5-137659

[51] Int. Cl.$^6$ ...................................................... G05F 3/02
[52] U.S. Cl. .......................... 327/543; 327/538; 327/541; 323/315
[58] Field of Search .............................. 327/63, 538, 539, 327/540, 541, 543, 545, 546, 563; 323/312, 315

[56] References Cited

U.S. PATENT DOCUMENTS

| | | | |
|---|---|---|---|
| 4,585,955 | 4/1986 | Uchida | 327/541 |
| 4,763,021 | 8/1988 | Stickel | 327/541 |
| 5,053,640 | 10/1991 | Yum | 327/539 |
| 5,105,101 | 4/1992 | Hinooka | 327/541 |
| 5,105,102 | 4/1992 | Shioda | 327/541 |
| 5,225,720 | 7/1993 | Kondoh et al. | 327/546 |
| 5,300,837 | 4/1994 | Fischer | 327/538 |
| 5,362,995 | 11/1994 | Kubo | 327/63 |

OTHER PUBLICATIONS

Analysis & Design of Analog Integrated Circuits, Second Edition, Paul R. Gray & Robert G. Meyer, pp. 736–737.
Journal of Solid State Circuits, vol. 24, No. 5, Oct. 1989, An Experimental 16–Mbit DRAM with Reduced Peak–Current Noise, Daeje Chin, Changhyun Kim, Yunho Choi, Dong––Sun Min, Hong Sun Hwang, Hoon Choi, Sooin Cho, Tae Young Chung, Chan J. Park, Yunseung Shin, Kwangpyuk Suh, & Yong E. Park, pp. 1191–1197.
"A Simple Three–Terminal IC Bandgap Reference", IEEE Journal of Solid–State Circuits, vol. SC–9 No. 6, Dec. 1974, A. Paul Brokaw.
Nagai, Patent Abstracts of Japan, vol. 15/No. 247, Jun. 1991.

*Primary Examiner*—Terry D. Cunningham
*Attorney, Agent, or Firm*—Oblon, Spivak, McClelland, Maier & Neustadt, P.C.

[57] ABSTRACT

A constant voltage generating device comprises a reference voltage generating circuit, a constant-current circuit unit and a current-to-voltage converting circuit unit. The reference voltage generating circuit generates a desired reference voltage. The constant-current circuit unit comprises a differential error amplifier to which the reference voltage generated by the reference voltage generating circuit is input as a reference potential, a first current controlling MOS transistor having a gate electrode to which an output of the differential amplifier is input, and a standard resistor serially connected to the first current controlling MOS transistor. The constant-current circuit unit generates a reference current to control a differential amplifier so that a constant current can be caused to flow therethrough. The current-to-voltage converting unit comprises a second current controlling MOS transistor constituting a current mirror together with the first current controlling MOS transistor of the constant-current circuit unit, and a current-to-voltage converting MOS transistor serially connected to the second current controlling MOS transistor and constituting a current mirror together with an active element unit current controlling MOS transistor of the differential amplifier.

12 Claims, 4 Drawing Sheets

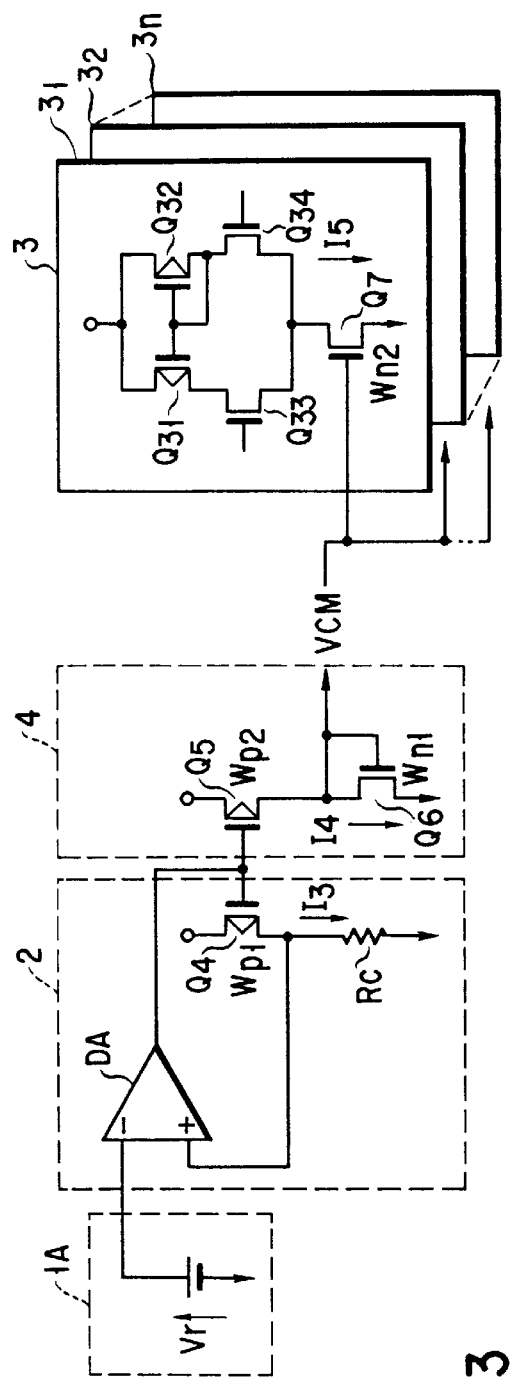
F I G. 3

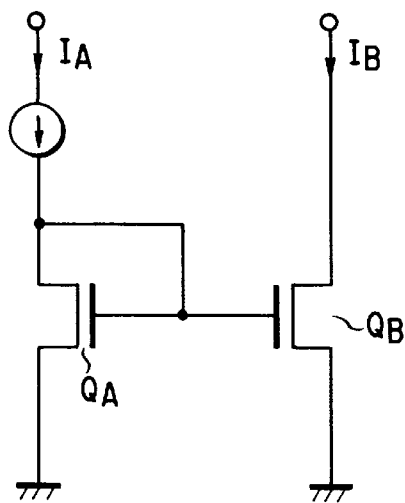
F I G. 4
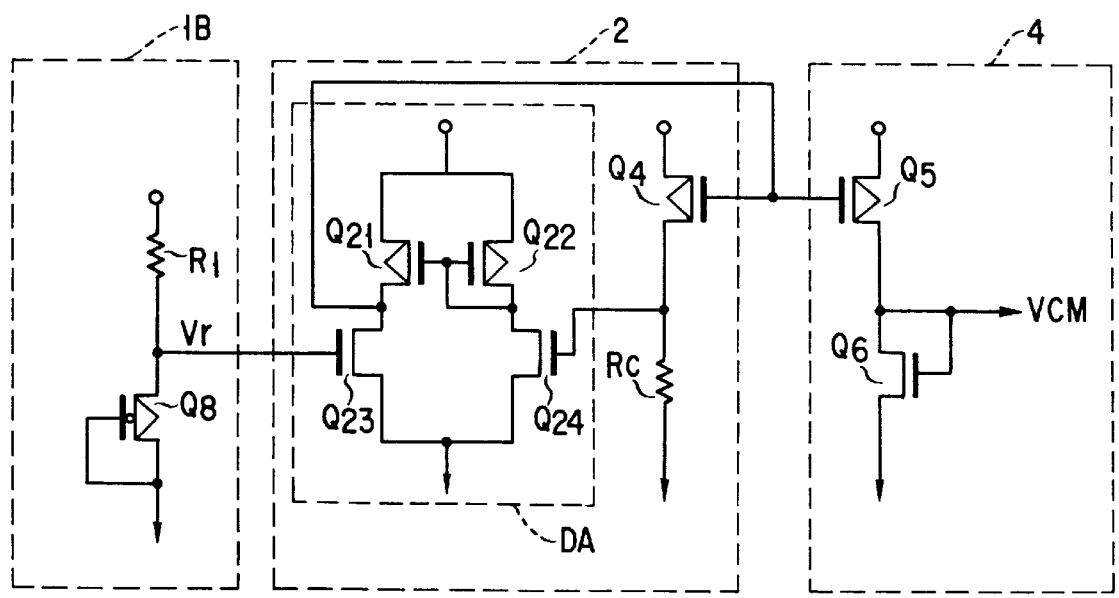
F I G. 5

CONSTANT-VOLTAGE GENERATING DEVICE

This application is a Continuation of application Ser. No. 08/591,942, filed on Jan. 23, 1996, now abandoned, which is a Continuation of application Ser. No. 08/257,183, filed on Jun. 8, 1994, now abandoned.

BACKGROUND OF THE INVENTION

1. Field of the Invention

The present invention relates to a constant-voltage generating device, such as a current-controlled voltage generating circuit, for generating an intermediate potential for maintaining a constant current flowing through a differential amplifier.

2. Description of the Related Art

In recent years, a MOS type semiconduct or memory, in which MOS transistors are integrated, includes not only digital circuits but also a number of analog circuits. For example, in a dynamic RAM (DRAM), a voltage down converter employed to assure the reliability of the MOSFET is a typical analog circuit. The voltage down converter step-downs an external voltage $V_{cc}$ in a memory chip, generates a voltage $V_{int}$ lower than the external supply voltage and uses the voltage $V_{int}$ as a source voltage of the memory chip.

Such an analog circuit mounted on a chip generally incorporates a voltage comparator circuit of differential amplifier type in order to compare a reference voltage $V_{ref}$ with a generated voltage $V_{int}$. The voltage comparator circuit of differential amplifier type inevitably consumes a DC through current because of its structure. Therefore, it is very important in designing of a voltage drop circuit to maintain a satisfactory response characteristic with a low through current.

FIG. 1 shows a relationship between the current consumption and the response characteristic in a voltage down converter on the basis of circuit simulation. In FIG. 1, the relationship between the current consumption and the response characteristic of a differential amplifier DA having a constant-current controlling circuit is compared with that of a differential amplifier DA which does not have a constant-current controlling circuit. A response characteristic curve AL indicates the characteristic of the differential amplifier DA having a non-current controlling circuit A and a response characteristic curve BL indicates the characteristic of the differential amplifier DA having a constant-current controlling circuit B. The abscissa represents current consumption under the conditions of a voltage of $V_{cc}+10\%$ at a low temperature, in which the current consumption is maximum, and the ordinate represents response characteristic under the conditions of a voltage of $V_{cc}-10\%$ at a high temperature, in which the response characteristic is maximum.

In the differential amplifier DA, the greater the current consumption, the shorter the response time, whether the constant-current controlling circuit is present or not. However, the differential amplifier DA having the constant-current controlling circuit B is more advantageous to assure an operation even under the worst conditions, in consideration of variance of parameters. For example, if the response characteristic is normalized at the current value of a point C in the differential amplifier DA having the constant-current controlling circuit B shown in FIG. 1, a response time of the differential amplifier DA having the non-constant current controlling circuit A is 3.7 times that of the differential amplifier DA having the constant-current controlling circuit B. On the other hand, to obtain a satisfactory response characteristic, the current consumption of the differential amplifier DA having the non-constant current controlling circuit A is three times that of the differential amplifier DA having the constant-current controlling circuit B. Since the constant-current control is also effective to stabilize a DC output level of a differential amplifier and assure a gain, various constant-current controlling circuits are incorporated in a memory device.

The constant-current controlling circuit has been positively employed not only in the voltage down converter but also in various voltage generating circuits (an intermediate potential generating circuit or a booster circuit) mounted on a chip, or in a system comprising a small amplitude data transmission system using a differential amplifier (e.g., JSSC, Vol. 26, No. 11, Nov. 1991, pp 1498–1505). A typical constant-current controlling circuit has a structure in which differential amplifiers integrated in a chip respectively incorporate current-controlling MOS transistors. In this structure, an intermediate potential, sufficient to cause a current-controlling MOS transistor to operate in a pentode region (saturated region), is input to the gate electrode of a current-controlling MOS transistor. A circuit for generating the intermediate potential is called a current-controlled voltage generating circuit, which is generally shared by a plurality of differential amplifiers.

FIG. 2 is a circuit diagram showing a current-controlled voltage generating circuit and a circuit system for controlling constant current. The current-controlled voltage generating circuit includes a reference voltage generating circuit 1A, a conventional continuous control type constant-current circuit 2 and a load transistor $Q_2$. The reference voltage generating circuit 1A generates a reference voltage $V_r$. The continuous control type constant-current circuit 2 includes a differential amplifier DA using the reference voltage $V_r$ as a reference potential, a current controlling transistor $Q_1$ having a gate electrode controlled by an output signal from the differential amplifier DA, and a standard resistor $R_c$ serially connected between the transistor $Q_1$ and the power source. The load transistor $Q_2$ converts a current value to a voltage value. The transistor $Q_2$ and a transistor $Q_3$ constitute a current mirror.

An output voltage $V_{cm}$ from the current-controlled voltage generating circuit is input to the gate electrode of the current controlling transistor $Q_3$ of each of differential amplifiers 3, thereby performing constant-current control. An operation principle of the current-controlled voltage generating circuit having the aforementioned structure will be described in brief. A reference current $I_1$ caused to flow through the load transistor $Q_2$ by the continuous control type constant-current circuit 2 is expressed by the following equation:

$$I_1 = V_r/R_c \qquad \ldots (1)$$

Since the transistors $Q_2$ and $Q_3$ constitute a current mirror, if the lengths of the gate electrodes of the transistors $Q_2$ and $Q_3$ are the same, a current $I_2$ flowing through each differential amplifier is expressed by the following equation:

$$I_2 = (W_2/W_1) \times I_1 \qquad \ldots (2)$$

where $W_1$ and $W_2$ are the widths of the gate electrodes of the transistors $Q_2$ and $Q_3$, respectively.

As clear from the above equations (1) and (2), $I_2$ is a constant value only depending on the reference voltage $V_r$ and the standard resistor $R_c$, independent of the supply voltage $V_{cc}$, temperature and transistor characteristics. Further, the current $I_2$ flowing through each of the differential amplifiers can be set to a desired value by suitably setting the device dimensions of the transistors $Q_2$ and $Q_3$.

Thus, the current-controlled voltage generating circuit shown in FIG. 2 is a very stable circuit, since the current value is determined only depending on the reference voltage value and the standard resistor value.

However, the minimum supply voltage to operate the current-controlled voltage generating circuit is defined by a current biasing stage in which the standard resistor $R_c$ and the two MOS transistors $Q_1$ and $Q_2$ are connected in series. In theory, the minimum supply voltage $V_{min}$ to operate the current-controlled voltage generating circuit is expressed by the following equation:

$$V_{min} = V_r + V_t \qquad \ldots (3)$$

where $V_t$ is the threshold voltage of the transistor $Q_2$. For example, if $V_r = 1.5$ V and $V_t = 0.5$ V, $V_{min} = 2.0$ V.

Actually, however, since the conductance of the current controlling transistor $Q_1$ is limited, voltage drop occurs between the source and drain of the transistor $Q_1$.

Hence, a supply voltage of 2.5 V or higher is required to maintain the constant current in the current-controlled voltage generating circuit.

In addition to the above problem of the lowering of the minimum supply voltage $V_{min}$ due to the voltage drop, the following problems due to the manufacturing process arise. The threshold voltage $V_t$ is different in manufactured chips due to fluctuation in the manufacturing process. In consideration of this matter, the minimum supply voltage $V_{min}$ must be higher (about 2.8 V). Therefore, the margin of the current-controlled voltage generating circuit to the $V_{cc}$ of 3.3 V employed in devices of 64 MDRAM generation is considerably reduced.

Moreover, the current-controlled voltage generating circuit defines the operation margin of a low supply voltage side of a DRAM.

The current-controlled voltage generating circuit requires two operations: constant-current control and current-to-voltage conversion. Since the two operations are achieved by the aforementioned single current biasing stage in which the three elements are connected in series, the operating limit voltage of the circuit cannot be low.

It is considerably disadvantageous that the operation limit voltage cannot be low, particularly in the following case: when, in the future, the scaling coefficient of the supply voltage becomes smaller than that of the threshold voltage of a MOS, i.e., if only the supply voltage is lowered to assure the reliability of the device MOSFET, although the threshold voltage $V_t$ cannot be lowered due to sub-threshold characteristics of the transistor. In this case, it is considerably disadvantageous that the operating limit voltage cannot be low.

As described above, the conventional current-controlled voltage generating circuit, having a structure in which a standard resistor, a current controlling transistor and the current-to-voltage converting load transistor connected in series, has a drawback in that when the supply voltage is lowered, the difference between the minimum supply voltage required to stably operate a circuit and the supply voltage supplied to the circuit becomes small, resulting in unstable operation.

SUMMARY OF THE INVENTION

The present invention has been made in consideration of the above situation, and its object is to provide a constant-voltage generating device in which the operation margin to the supply voltage is great, and a stable operation is maintained, even if the supply voltage is low.

The above object is achieved by a constant voltage generating device for generating a predetermined voltage to be supplied to an active circuit unit, the device comprising:
  a constant-current circuit unit for generating a reference current; and
  a current-to-voltage converting circuit unit, connected to the constant-current circuit unit to constitute a current mirror, for converting the reference current generated by the constant-current circuit unit to a reference voltage and supplying the reference voltage to the active circuit unit as the predetermined voltage.

The above object can also be achieved by a constant voltage generating device for controlling at least one of differential amplifiers, each incorporating an active element unit current controlling MOS transistors, so that a constant current can be caused to flow therethrough, by supplying an intermediate potential sufficient to operate an active element unit current controlling MOS transistor in a pentode region to a gate electrode of the active element unit current controlling MOS transistor, the constant voltage generating device comprising:
  a reference voltage generating circuit for generating a desired reference voltage;
  a constant-current circuit unit for generating a reference current to control the at least one differential amplifier so that a constant current can be caused to flow therethrough, the constant-current circuit unit comprising a differential amplifier to which the reference voltage generated by the reference voltage generating circuit is input as a reference potential, a first current controlling MOS transistor having a gate electrode to which an output of the differential amplifier is input, and a standard resistor serially connected to the first current controlling MOS transistor; and
  a current-to-voltage converting circuit unit for converting the reference current to a reference voltage, the current-to-voltage converting unit comprising a second current controlling MOS transistor constituting a current mirror together with the first current controlling MOS transistor of the constant-current circuit unit, and a current-to-voltage converting MOS transistor serially connected to the second current controlling MOS transistor and constituting a current mirror together with the active element unit current controlling MOS transistor.

According to the constant-voltage generating device of the present invention, a constant-current circuit unit and a current-to-voltage converting circuit unit are individually provided to control differential amplifiers, such that a constant current is caused to flow therethrough, and these circuit are connected to constitute a current mirror circuit. Thus, since the number of circuit elements connected in series is decreased, an operable minimum supply voltage can be suppressed. As a result, a constant-voltage generating device having a great operation margin to the supply voltage can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram showing a current-controlled voltage generating circuit according to a first embodiment of the present invention and a system using the current-controlled voltage generating circuit;

FIG. 4 is a circuit diagram showing a typical current mirror circuit using MOS transistors;

FIG. 5 is a circuit diagram showing a configuration of the current-controlled voltage generating circuit used in the first embodiment;

DETAILED DESCRIPTION OF THE PREFERRED EMBODIMENTS

Figure 1:
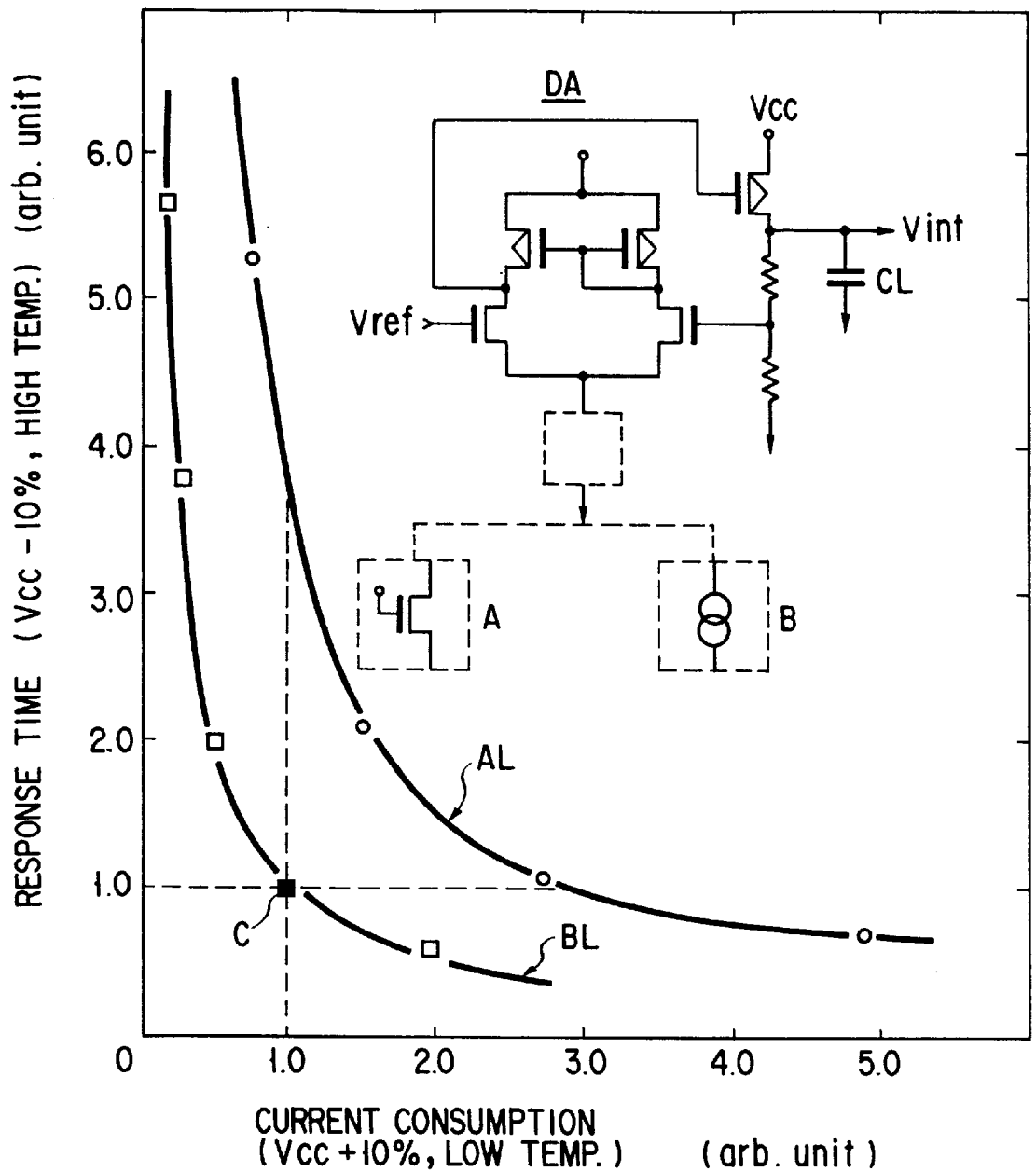
FIG. 1 is a diagram showing the relationship between the current consumption and the response speed in a differential amplifier.
Figure 2:
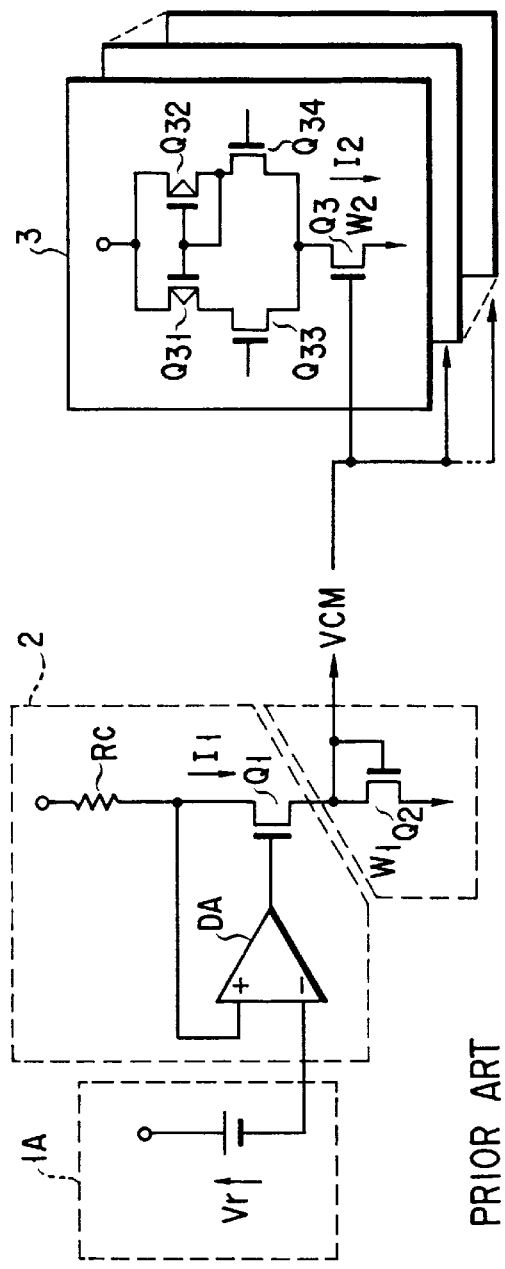
FIG. 2 is a circuit diagram showing a conventional current-controlled voltage generating circuit.

Embodiments of the present invention will be described with reference to the accompanying documents.

FIG. 3 is a circuit diagram showing a current-controlled voltage generating circuit (a constant-voltage generating device) according to a first embodiment of the present invention and a system using the circuit. The current-controlled voltage generating circuit of this embodiment includes a reference voltage generating circuit unit 1 (1A) for generating a reference voltage $V_r$, a continuous control type constant-current circuit unit 2 for generating a reference current to cause a constant current to flow through an active element unit constituted by a plurality of differential amplifiers 3, and a current-to-voltage converting circuit unit 4 for converting the reference current to a reference voltage. Each of the differential amplifiers 3 has MOS transistors $Q_{31}$, $Q_{32}$, $Q_{33}$ and $Q_{34}$. Reference numerals $3_1$ $3_2$ . . . $3_n$ denote the number of the differential amplifiers 3. In other words, the active element unit shown in FIG. 3 is constituted by the n-number of differential amplifiers 3. The n-number of differential amplifiers 3 are controlled in one lump by a voltage $V_{cm}$ output from the current-to-voltage converting circuit unit 4, so that a constant current is caused to flow therethrough. However, only one or a few of the n-number of differential amplifiers can be controlled by the voltage $V_{cm}$ output from the current-to-voltage converting circuit unit 4, so that a constant current is caused to flow therethrough.

The continuous control type constant-current circuit unit 2 includes a differential amplifier DA to which the reference voltage $V_r$ is input, a current-controlling MOS transistor $Q_4$ having a gate electrode to which an output from the differential amplifier DA is input, and a standard resistor $R_c$ serially connected to the transistor $Q_4$. The current-to-voltage converting circuit unit 4 includes a MOS transistor $Q_5$, which constitutes a current mirror together with the current-controlling MOS transistor $Q_4$, and a load MOS transistor $Q_6$, serially connected to the transistor $Q_5$, for converting a current to a voltage. A voltage $V_{cm}$ output from the continuous control type constant-current circuit 2 is input to the gate electrode of a transistor $Q_7$ of each differential amplifier 3 of the active element unit, thereby performing a constant-current control.

A typical current mirror circuit will be described with reference to FIG. 4.

As shown in FIG. 4, the gate electrodes of transistors $Q_A$ and $Q_B$ are connected to each other. The drain electrode of the transistor $Q_A$ is connected to the gate electrodes of the transistors $Q_A$ and $Q_B$. In the current mirror circuit, when a current $I_A$ is supplied to the transistor $Q_A$, a current $I_B$ ($I_B=I_A$) is current-mirrored through the drain electrode of the transistor $Q_B$. This characteristic of the current mirror circuit is obtained only when the gate-source characteristic of the transistor $Q_A$ is equal to that of transistor $Q_B$.

The operation principle of the circuit of the above embodiment will now be described. A current $I_3$ caused to flow through the current controlling MOS transistor $Q_4$ by the continuous control type constant-current circuit 2 is expressed by the following equation:

$$I_3=V_r/R_c \qquad \ldots (4)$$

Since the MOS transistors $Q_4$ and $Q_5$ constitute a current mirror, if the gate electrode lengths of these transistors are set equal to each other, a current $I_4$ flowing through the current-to-voltage converting circuit 4 is expressed by the following equation:

$$I_4=(W_{p2}/W_{p1})\times I_3 \qquad \ldots (5)$$

where $W_{p1}$ and $W_{p2}$ are the widths of the gate electrodes of the transistors $Q_4$ and $Q_5$, respectively.

Further, since the MOS transistors $Q_6$ and $Q_7$ constitute a current mirror, if the gate electrode lengths of these transistors are set equal to each other, a current $I_5$ flowing through each of the differential amplifiers 3 is expressed by the following equation:

$$I_5=(W_{n2}/W_{n1})\times I_3 \qquad \ldots (6)$$

where $W_{n1}$ and $W_{n2}$ are the widths of the gate electrodes of the transistors $Q_6$ and $Q_7$, respectively.

The current $I_5$ can be set to a desired value by suitably selecting the ratio of the gate electrode width of the transistor $Q_4$ to that of the transistor $Q_5$ and the ratio of the gate electrode width of the transistor $Q_6$ to that of the transistor $Q_7$. If the reference potential $V_r$ is set higher than the threshold voltage $V_{tn}$ of the transistor $Q_6$, the source-drain voltage of the transistor $Q_5$ is inevitably higher than that of the transistor $Q_4$. It follows that, if the circuit constants of the transistor $Q_4$ and the differential amplifier DA are selected so that the transistor $Q_4$ can operate in the pentode region, the transistor $Q_5$ inevitably operates in the pentode region.

In other words, in the circuit configuration of this embodiment, a stable current-controlled voltage generating circuit can be obtained, irrespective of variation of the supply voltage, the temperature, or the transistor characteristics, merely by taking the operation region of the transistor $Q_4$ into consideration.

The operable minimum supply voltage $V_{min}$ of the above embodiment is determined by the constant-current circuit unit 2 and expressed by the following equation, if Vr>threshold voltage of the transistor $Q_6$ as mentioned above:

$$V_{min}=V_r+|V_{tp}| \qquad \ldots (7)$$

where $V_{tp}$ is the threshold voltage of the transistor $Q_4$. According to this equation, if $V_r=1.5$ V and $|V_{tp}|=0.5$ V, $V_{min}=2.0$ V.

In this embodiment, the transistor $Q_4$ and the standard resistor $R_c$ (or transistors $Q_5$ and $Q_6$) are connected in series between the power source terminal and the ground. This is different from the conventional circuit (FIG. 6) in which the standard resistor $R_c$ and the transistors $Q_1$ and $Q_2$ are connected in series, wherein it is necessary to rise the minimum supply voltage to compensate the voltage drop between the source and the drain of the transistor $Q_1$. Therefore, although the operable minimum supply voltage $V_{min}$ of this embodiment (equation (7)) is the same as that of the conventional circuit (equation (3)) in theory, the operable minimum voltage in actual use can be lower than that of the conventional circuit.

As described above, in the current-controlled voltage generating circuit of the first embodiment, the constant-current circuit unit 2 and the current-to-voltage converting circuit unit 4 are individually provided in two stages and the stage of each circuit unit is formed of a current mirror structure, unlike in the conventional circuit. In this manner, only two serially-connected circuit elements suffice to constitute each stage, thereby increasing the operable minimum voltage. It follows that the operation margin to the supply voltage can be increased, which assures a stable operation even under a low supply voltage. Thus, the great advantages can be obtained by the circuit of this embodiment.

FIG. 5 shows an example of the circuit used in the first embodiment. This circuit employs a reference voltage generating circuit unit 1 (1B) for generating a reference voltage $V_r$ using the threshold voltage of an essentially intrinsic type pMOS transistor $Q_8$. The reference voltage $V_r$ generated by the reference voltage generating circuit unit 1 (1B) is relatively stable with respect to a process variation and a change in temperature, since an essentially intrinsic type pMOS transistor itself is relatively stable with respect to a process variation and a change in temperature.

FIG. 5 also shows a detailed structure of the differential amplifier DA, which is a current mirror amplifier constituted by MOS transistors $Q_{21}$, $Q_{22}$, $Q_{23}$ and $Q_{24}$.

According to the embodiment using the circuit shown in FIG. 5, the voltage supplied to the active element unit can be further stabilized.

Figure 6:
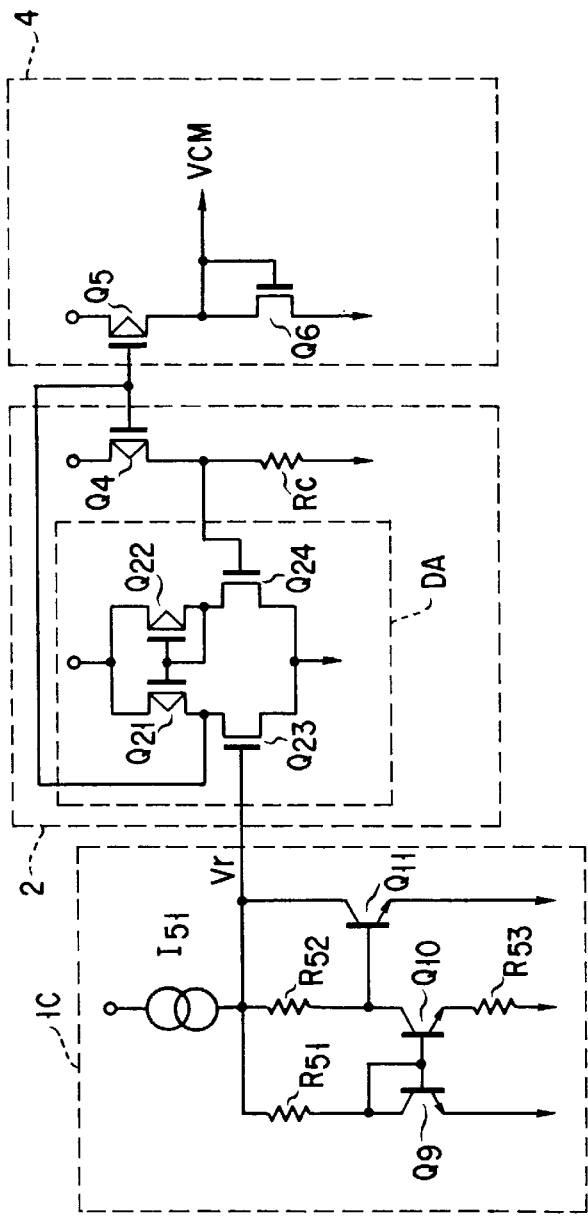
FIG. 6 is a circuit diagram showing another configuration of the current-controlled voltage generating circuit used in the first embodiment.

FIG. 6 shows another example of the circuit used in the first embodiment. The circuit shown in FIG. 6 differs from that shown in FIG. 5 in that a band-gap reference circuit (BGR circuit) having of a bipolar transistor is used as a circuit 1 (1C) for generating a reference voltage $V_r$. FIG. 6 shows the most simple structure of the BGR circuit, which comprises three bipolar transistors $Q_9$, $Q_{10}$ and $Q_{11}$, resistors $R_{51}$, $R_{52}$ and $R_{53}$ and a current source $I_{51}$. A main object of the BGR circuit 1C is temperature compensation of the reference potential. For example, a constant-current circuit, on which a BGR circuit having a parasitic bipolar transistor (transistors?) is incorporated in a chip of a DRAM produced by a CMOS process, is known (e.g., JSSC, Vol. 24, No. 5, Oct. 1989, pp 1191–1197).

The operation principle of the BGR circuit 1C is as follows. The base-emitter voltage ($V_{be}$) having a negative temperature dependency in a bipolar transistor is added to a thermal voltage (kT/q) having a positive temperature dependency in a bipolar transistor, thereby offsetting the temperature dependency coefficient, so that a reference voltage having no temperature dependency can be obtained.

With this circuit using the BGR circuit, a more stable current-controlled generating circuit having no temperature dependency is obtained. Thus, the circuit shown in FIG. 6 has an improved characteristic as compared to the circuit shown in FIG. 5.

Figure 7:
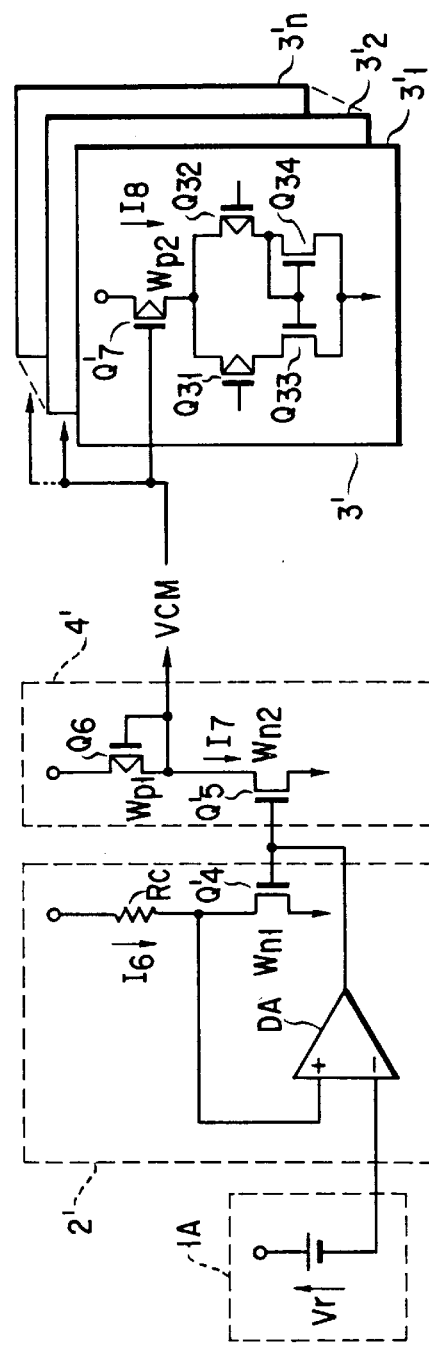
FIG. 7 is a circuit diagram showing a current-controlled voltage generating circuit according to a second embodiment of the present invention and a system using the current-controlled voltage generating circuit.

FIG. 7 is a circuit diagram showing a current-controlled voltage generating circuit according to a second embodiment of the present invention and a system using the circuit. In this embodiment, a pMOS transistor is used as a current controlling transistor $Q_{7'}$ of the differential amplifier 3. In FIG. 7, the same elements as shown in FIG. 3 are identified with the same reference numerals and detailed descriptions thereof are omitted.

The second embodiment is different from the first embodiment shown in FIG. 3 in that a constant-current circuit unit 2' and a current-to-voltage converting circuit unit 4' in a current-controlled voltage generating circuit are complementary to those of the circuit shown in FIG. 3. The operation principle of the circuit is the same as that of the embodiment shown in FIG. 3. $V_{min}$ of the circuit is expressed by the following equation;

$$V_{min}=V_r+V_{tn} \qquad \ldots (8)$$

where $v_{tn}$ is the threshold voltage of a transistor $Q_{4'}$.

The operable minimum supply voltage can be greater as compared to that of the conventional circuit, like the embodiment shown in FIG. 3.

In the above description, the semiconductor memory device, particularly the DRAM is mainly explained. However, the present invention can be applied to other memory devices having a constant current circuit, such as a SRAM or a PROM. The present invention can also be applied to a logic device having a constant-current circuit, other than a memory device. In such a constant-current circuit, a constant current control can be performed by a constant-voltage generating device (a current-controlled voltage generating circuit) of the present invention.

As has been described above, in the present invention, a constant-current circuit unit and a current-to-voltage converting circuit unit are individually provided to control differential amplifiers, such that a constant current is caused to flow therethrough, and these circuit are connected to constitute a current mirror circuit. As a result, the number of circuit elements connected in series is decreased. Thus, a constant-voltage generating device having a great operation margin to the supply voltage can be obtained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. Electric circuitry for connection to each of a plurality of current controlling transistors of a respective plurality of differential amplifiers, said differential amplifiers having at least a pair of transistors which are coupled to a current controlling transistor to amplify a differential voltage signal between voltage signals which supplied to the pair of transistors, said circuitry comprising:

a reference voltage generating circuit;

an input differential amplifier to which a reference voltage generated by the reference voltage generating circuit is input as a reference potential;

a first current controlling transistor having a gate electrode to which an output of the differential amplifier is input:

a standard resistor serially connected to the first current controlling transistor; and a current-to-voltage converting circuit having a second transistor and a current-to-voltage converting transistor, said current-to-voltage converting circuit being connected to the gate electrode of said first current controlling transistor wherein said first current controlling transistor and said second transistor together provide one current mirror said current-to-voltage converting circuit converting a reference current generated by the first controlling transistor to a reference voltage and supplying the reference voltage to each current controlling transistor of the differential amplifier units to provide other current mirrors formed by the respective corresponding current-to-voltage converting transistor and the current controlling transistors of each of said plurality of differential amplifiers.

2. The device according to claim 1, wherein the reference voltage generating circuit comprises means for generating a reference voltage utilizing a threshold voltage of an essentially intrinsic type pMOS transistor.

3. The device according to claim 1, wherein the reference voltage generating circuit comprises a band-gap reference circuit having a bipolar transistor as a main element.

4. The device according to claim 1, wherein the differential amplifier comprises a current mirror type differential amplifier.

5. The device according to claim 1, wherein the current controlling transistors have gate electrodes, to which a voltage to operate the first and second current controlling transistors in a pentode region is supplied.

6. The device according to claim 1, wherein the constant-current circuit unit and the current-to-voltage converting circuit unit have complementary structure.

7. A constant voltage generating apparatus for controlling a plurality of differential amplifier units, each incorporating current controlling MOS transistor, so that a constant current is caused to flow therethrough, by supplying an intermediate potential sufficient to operate the current controlling MOS transistors in a pentode region to gate electrodes of the current controlling MOS transistors, said constant voltage generating device comprising:

a reference voltage generating circuit for generating a desired reference voltage;

a constant-current circuit unit for generating a reference current, said constant-current circuit unit comprising a differential amplifier to which the reference voltage generated by the reference voltage generating circuit is input as a reference potential, a first current controlling MOS transistor having a gate electrode to which an output of the differential amplifier is input, and a standard resistor serially connected to the first current controlling MOS transistor; and a current-to-voltage converting circuit unit for converting the reference current to a reference voltage, said current-to-voltage converting unit comprising a second current controlling MOS transistor constituting a current mirror together with the first current controlling MOS transistor of the constant-current circuit unit, and a current-to-voltage converting MOS transistor serially connected to the second current controlling MOS transistor and constituting current mirrors together with the current controlling MOS transistors of the differential amplifier units, wherein the constant-current circuit unit and the current-to-voltage converting circuit unit have a complementary structure.

8. The device according to claim 7, wherein the reference voltage generating circuit comprises means for generating a reference voltage utilizing a threshold voltage of an essentially intrinsic type pMOS transistor.

9. The device according to claim 7, wherein the reference voltage generating circuit comprises a band-gap reference circuit having a bipolar transistor as a main element.

10. Electric circuitry used in an MOS type semiconductor memory, said circuitry comprising:

a plurality of for controlling respective MOS transistors differential amplifiers, so that a constant current is caused to flow therethrough, by supplying an intermediate I potential sufficient to operate the current controlling MOS transistors in a pentode region to gate electrodes of the current controlling MOS transistors;

a reference voltage generating circuit for generating a desired reference voltage;

a constant-current circuit unit for generating a reference current, said constant-current circuit unit comprising a differential amplifier to which the reference voltage generated by the reference voltage generating circuit is input as a reference potential, a first current controlling MOS transistor having a gate electrode to which an output of the differential amplifier is input, and a standard resistor serially connected to the first current controlling MOS transistor; and a current-to-voltage converting circuit unit for converting the reference current to a reference voltage which is supplied to the current controlling MOS transistors of the differential amplifier units, said current-to-voltage converting unit comprising a second current controlling MOS transistor constituting a current mirror together with the first current controlling MOS transistor of the constant-current circuit and a current-to-voltage converting MOS transistor unit, serially connected to the second current controlling MOS transistor and constituting current mirrors together with the current controlling MOS transistors of the differential amplifier units, wherein the constant-current circuit unit and the current-to-voltage converting circuit unit are complementary.

11. The device according to claim 10, wherein the reference voltage generating circuit comprises means for generating a reference voltage by utilizing a threshold voltage of an essentially intrinsic pMOS transistor.

12. The device according to claim 10, wherein the reference voltage generating circuit comprises a band-gap reference circuit having a bipolar transistor as a main element.

* * * * *